(12) United States Patent
Ishio et al.

(10) Patent No.: US 7,105,910 B2
(45) Date of Patent: Sep. 12, 2006

(54) SEMICONDUCTOR DEVICE HAVING SOI CONSTRUCTION

(75) Inventors: Seiichiro Ishio, Kariya (JP); Akira Tai, Okazaki (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/994,294

(22) Filed: Nov. 23, 2004

(65) Prior Publication Data

US 2005/0110116 A1 May 26, 2005

(30) Foreign Application Priority Data

Nov. 25, 2003 (JP) .............................. 2003-394456

(51) Int. Cl.
*H01L 29/00* (2006.01)
(52) U.S. Cl. ...................... 257/535; 257/350
(58) Field of Classification Search ................ 257/532, 257/533, 534, 516, 350, 379, 592, 535
See application file for complete search history.

(56) References Cited

U.S. PATENT DOCUMENTS

| 5,442,223 | A | 8/1995 | Fujii |
| 6,057,588 | A | 5/2000 | Yamazaki |
| 6,303,954 | B1 | 10/2001 | Ohoka |
| 6,429,486 | B1 | 8/2002 | Abe et al. |
| 6,661,076 | B1 | 12/2003 | Toeda et al. |
| 6,667,518 | B1 * | 12/2003 | Christensen et al. ........ 257/350 |
| 2004/0061163 | A1 | 4/2004 | Nakayama |

FOREIGN PATENT DOCUMENTS

| JP | A-5-190874 | 7/1993 |
| JP | A-8-088332 | 4/1996 |
| JP | A-10-144894 | 5/1998 |
| JP | 2003045988 | * 2/2003 |
| JP | A-2003-045988 | 2/2003 |
| JP | 2003347488 | * 12/2003 |
| JP | A-2003-347488 | 12/2003 |

* cited by examiner

*Primary Examiner*—Minhloan Tran
*Assistant Examiner*—Benjamin Tzu-Hung Liu
(74) *Attorney, Agent, or Firm*—Posz Law Group, PLC

(57) ABSTRACT

A semiconductor device includes: a semiconductor substrate including a first semiconductor layer, an insulation layer and a second semiconductor layer, which are laminated in this order; a trench penetrating both of the second semiconductor layer and the insulation layer and reaching the first semiconductor layer; and a third semiconductor layer. The trench has a ring shape on a principal surface of the substrate so that a part of the second semiconductor layer and a part of the insulation layer are surrounded with the trench. The third semiconductor layer is disposed in the trench through a first insulation film disposed on a sidewall of the trench so that the third semiconductor layer contacts the first semiconductor layer at a bottom of the trench.

35 Claims, 10 Drawing Sheets

SEMICONDUCTOR DEVICE HAVING SOI CONSTRUCTION

CROSS REFERENCE TO RELATED APPLICATION

This application is based on Japanese Patent Application No. 2003-394456 filed on Nov. 25, 2003, the disclosure of which is incorporated herein by reference.

FIELD OF THE INVENTION

The present invention relates to a semiconductor device having a SOI (i.e., silicon on insulator) substrate, and more particularly to a semiconductor device utilizing a trench sidewall insulation film as a dielectric film of a capacitor.

BACKGROUND OF THE INVENTION

SOI (silicon on insulator) technology is employed to achieve semiconductor elements with higher speeds and higher degrees of integration. SOI technology includes the steps of forming a semiconductor layer on an insulation board, and then forming semiconductor elements in the semiconductor layer.

For example, U.S. Pat. No. 6,429,486 discloses a semiconductor device employing a semiconductor board with an SOI structure having a buried insulation film.

FIG. 12 is a cross section of the semiconductor device 80 disclosed in U.S. Pat. No. 6,429,486.

The semiconductor device 80 shown in FIG. 12 has a semiconductor substrate 81, an insulation oxide film 82, an SOI layer 83, and an insulation layer oxide film 86. An opening 84 is formed through the insulation oxide film 82 and SOI layer 83, and reaches the semiconductor substrate 81. The opening 84 is filled with a p-type poly-silicon to form a conductor layer 85. An opening 87 is formed through the insulation layer oxide film 86 on the SOI layer 83 and filled with an electrode 88 to form an electrical connection to the conductor layer 85. The electrode 88 formed on the front side of the semiconductor device 80 fixes the potential of the semiconductor substrate 81. For this reason, a semiconductor device is achieved that can prevent malfunctioning of semiconductor elements by fixing the potential of the semiconductor substrate 81, even in a package in which the electrode on its backside cannot be connected to an outside terminal.

Here, flip-chip packaging is employed as a packaging method for highly integrated high-speed semiconductor chips. Flip-chip packaging includes the steps of forming solder bumps on the main side of a semiconductor chip on which semiconductor elements are formed, and then connecting the main side of the chip to a wiring board, on which the chip is to be mounted, via the bumps. Flip-chip packaging is suitable to the high speeds and high degrees of integration of semiconductor chips due to SOI technology because it can lower the wiring delay and downsize the package. In recent years, for flip-chip packaging implementation, CSP (chip size package) structure has been studied, in which the size of the wiring board is made to be nearly the same as the semiconductor chip with the aim of further downsizing.

Semiconductor elements boasting high speeds and high degrees of integration due to SOI technology have had the problem that heat generated during operation cannot be easily radiated outside the semiconductor device due to the presence of substrates having a low thermal conductivity. Even in flip-chip packaging, the heat radiation capability is lower compared to the conventional packaging method of bonding the back side of semiconductor chips to wiring boards, being especially prominent in CSP structures. For this reason, in the highly integrated high-speed semiconductor devices, such problems easily arise as changes in the element characteristics, increase in wiring resistance, melting of the solder bumps, or peeling of the protective film due to thermal stress.

Further, malfunctioning or the like due to noise cannot be completely eliminated, in the semiconductor device 80 shown in FIG. 12, although the potential of the semiconductor substrate 81 is fixed. Therefore, in order to inhibit malfunctioning or the like due to noise, it is necessary to add capacitors, resistors, etc. to a wiring board to form a noise removing circuit. However, mounting these elements inevitably enlarges the overall size of the package.

SUMMARY OF THE INVENTION

In view of the above-described problem, it is an object of the present invention to provide a semiconductor device having small dimensions and low noise performance.

A semiconductor device includes: a semiconductor substrate including a first semiconductor layer, an insulation layer and a second semiconductor layer, which are laminated in this order; a trench penetrating both of the second semiconductor layer and the insulation layer and reaching the first semiconductor layer; and a third semiconductor layer. The second semiconductor layer is disposed on a principal surface of the substrate, and the first semiconductor layer is disposed on a backside of the substrate. The trench has a ring shape on the principal surface so that a part of the second semiconductor layer and a part of the insulation layer are surrounded with the trench. The third semiconductor layer is disposed in the trench through a first insulation film disposed on a sidewall of the trench so that the third semiconductor layer contacts the first semiconductor layer at a bottom of the trench.

In the above device, the third semiconductor layer embedded in the trench fixes the electric potential of the first semiconductor layer disposed on the backside of the semiconductor substrate. Therefore, the noise of the device can be reduced. Further, the third semiconductor layer is provided by a vertical type construction so that the device has small dimensions. Thus, the device has small dimensions and low noise performance.

Preferably, the device further includes first and second electrodes. The first electrode is disposed on the principal surface of the substrate through a second insulation film, and electrically connects to the third semiconductor layer through a contact hole. The second electrode is disposed on the principal surface of the substrate through the second insulation film, and electrically connects to the part of the second semiconductor layer surrounded by the trench through another contact hole.

Preferably, the first semiconductor layer has a first conductive type, the second semiconductor layer has a second conductive type, and the third semiconductor layer has the first conductive type with an impurity concentration higher than the first semiconductor layer. More preferably, the part of the second semiconductor layer surrounded by the trench further includes a diffusion layer disposed inside of the first insulation film so that the diffusion layer surrounds the part of the second semiconductor layer. The diffusion layer has the second conductive type with an impurity concentration higher than the part of the second semiconductor layer. The second electrode on the second insulation layer connects to the diffusion layer through the contact hole. Furthermore preferably, the third semiconductor layer, the first insulation film and the diffusion layer provide a first capacitor. In this case, the diffusion layer is used for one electrode of the first capacitor so that the impurity concentration of the second semiconductor layer can be reduced. Therefore, semiconductor elements and the like can be formed and integrated in the second semiconductor layer so that the dimensions of the device are reduced.

Preferably, the device further includes a fourth semiconductor layer disposed between the insulation layer and the second semiconductor layer. The fourth semiconductor layer has the second conductive type with an impurity concentration higher than the second semiconductor layer. The fourth semiconductor layer contacts the diffusion layer. More preferably, the fourth semiconductor layer, the insulation layer and the first semiconductor layer provide a second capacitor. In this case, the fourth semiconductor layer is used for one electrode of the second capacitor so that the impurity concentration of the second semiconductor layer can be reduced. Therefore, semiconductor elements and the like can be formed and integrated in the second semiconductor layer so that the dimensions of the device are reduced.

In the above cases, the impurity concentration of the third semiconductor layer in the trench can be controlled appropriately so that the third semiconductor layer is used for a resistor. This resistor and the above capacitors can reduce the noise of the device. Further, the resistor and the capacitors are provided by a vertical type construction so that dimensions of the device are small. Therefore, the device has small dimensions and low noise performance.

Further, a semiconductor device includes: a semiconductor substrate including a first semiconductor layer, an insulation layer and a second semiconductor layer, which are laminated in this order; a trench penetrating the second semiconductor layer and reaching the insulation layer; a third semiconductor layer; and first and second electrodes. The first semiconductor layer is disposed on a backside of the substrate, and the second semiconductor layer is disposed on a principal surface of the substrate. The trench has a ring shape on the principal surface in a plan view so that a part of the second semiconductor layer is surrounded with the trench. The third semiconductor layer is disposed in the trench through a first insulation film disposed on a sidewall of the trench. The first electrode is disposed on the principal surface of the substrate through a second insulation film, and electrically connects to the third semiconductor layer in the trench through a contact hole. The second electrode is disposed on the principal surface of the substrate through the second insulation film, and electrically connects to the part of the second semiconductor layer through another contact hole.

In the above device, the noise of the device can be reduced. Further, the third semiconductor layer is provided by a vertical type construction so that the device has small dimensions. Thus, the device has small dimensions and low noise performance. Further, the trench does not penetrate the insulation layer so that the method for manufacturing the device is simplified.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

First Embodiment

The inventors have preliminarily studied about a semiconductor device having a SOI construction.

Figure 13:
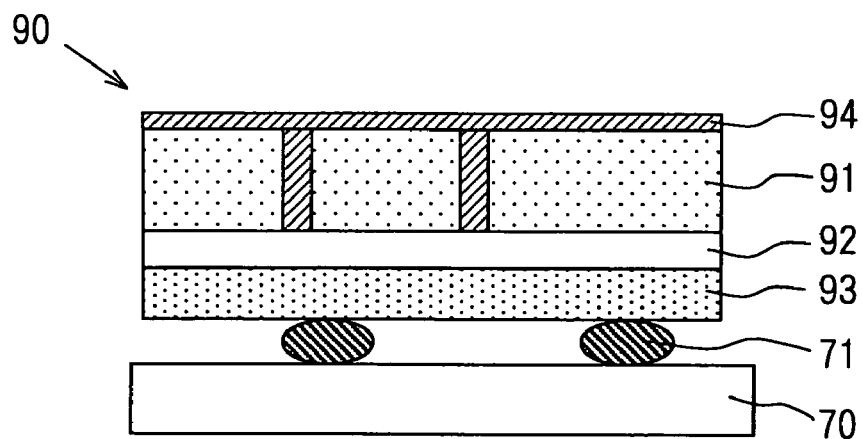
FIG. 13 is a cross sectional view showing a semiconductor device according to a comparison of the first embodiment.

A semiconductor device 90 shown in FIG. 13 has been studied. FIG. 13 is a typical cross section showing the semiconductor device 90 in a state in which a flip chip is mounted on a wiring board 70 with solder bumps 71 interposed between them.

The semiconductor device 90 shown in FIG. 13 employs a semiconductor board with an SOI structure having a buried insulation film 92. A first semiconductor layer 91 and a metallic layer 94 are formed on the backside (the upper side in FIG. 13) of the buried insulation film 92. A second semiconductor layer 93 is formed on the main side (the lower side in FIG. 13) of the buried insulation film 92, with semiconductor elements formed in the second semiconductor layer 93. Heat generated in the semiconductor elements is radiated through the metallic layer 94 formed on the first semiconductor layer 91. This allows for a semiconductor device with enhanced heat radiation capability without inhibiting the high speeds and high degrees of integration of semiconductor elements due to SOI technology and the package downsizing by flip-chip packaging.

Figure 12:
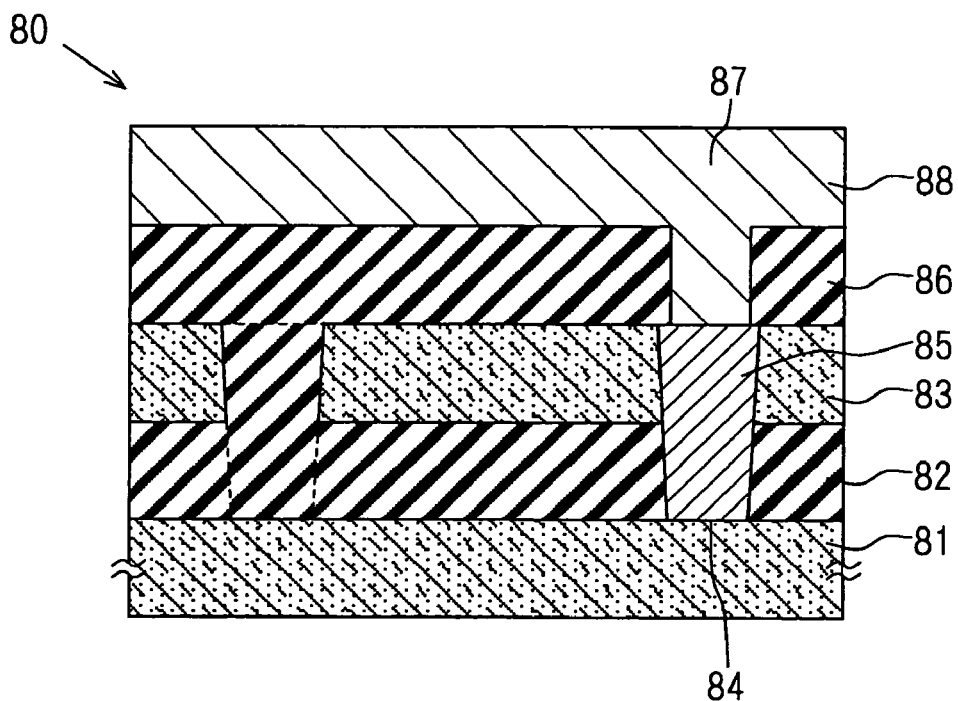
FIG. 12 is a cross sectional view showing a semiconductor device according to a prior art.

Although the heat radiation capability of the semiconductor device 90 can be improved, it has been proven that the metallic layer 94 on the first semiconductor layer 91 functions as a noise antenna, and that malfunctioning or output fluctuations of the device due to noise easily occur. Such malfunctioning or the like due to noise cannot be completely eliminated, even in the semiconductor device 80 shown in FIG. 12, where the potential of the semiconductor substrate 81 is fixed. Therefore, in order to inhibit malfunctioning or the like due to noise, it is necessary to add capacitors, resistors, etc. to the wiring board 70 to form a noise removing circuit. However, mounting these elements inevitably enlarges the overall size of the package.

In view of the above difficulty, a semiconductor device according to a first embodiment of the present invention is provided.

Figure 1A:
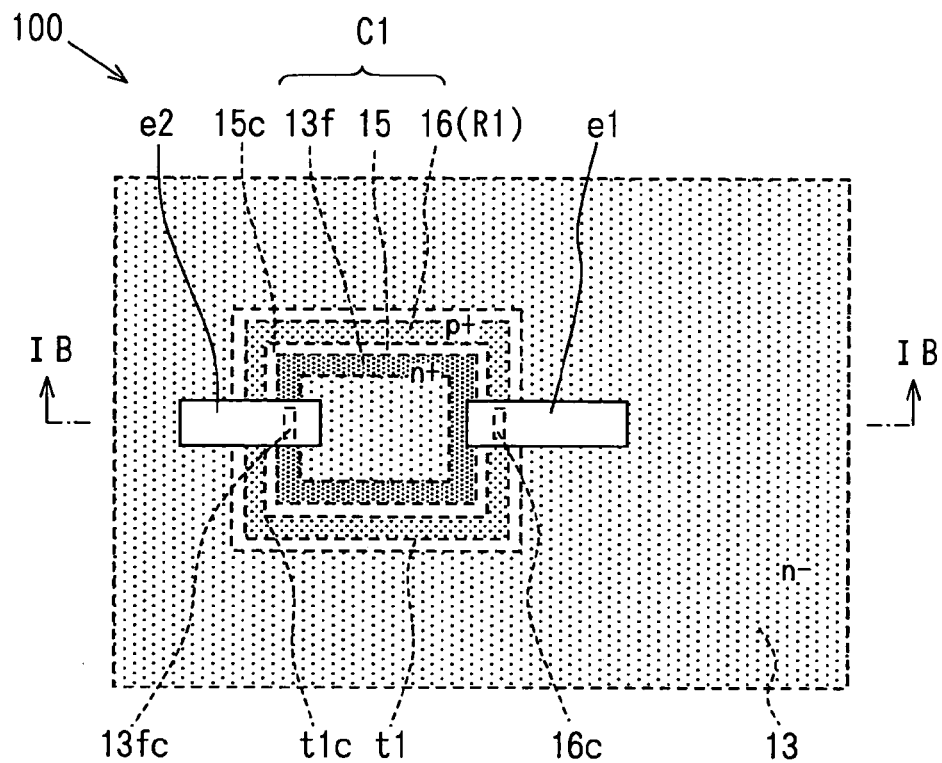
FIG. 1A is a plan view showing a semiconductor device according to a first embodiment of the present invention.
Figure 1B:
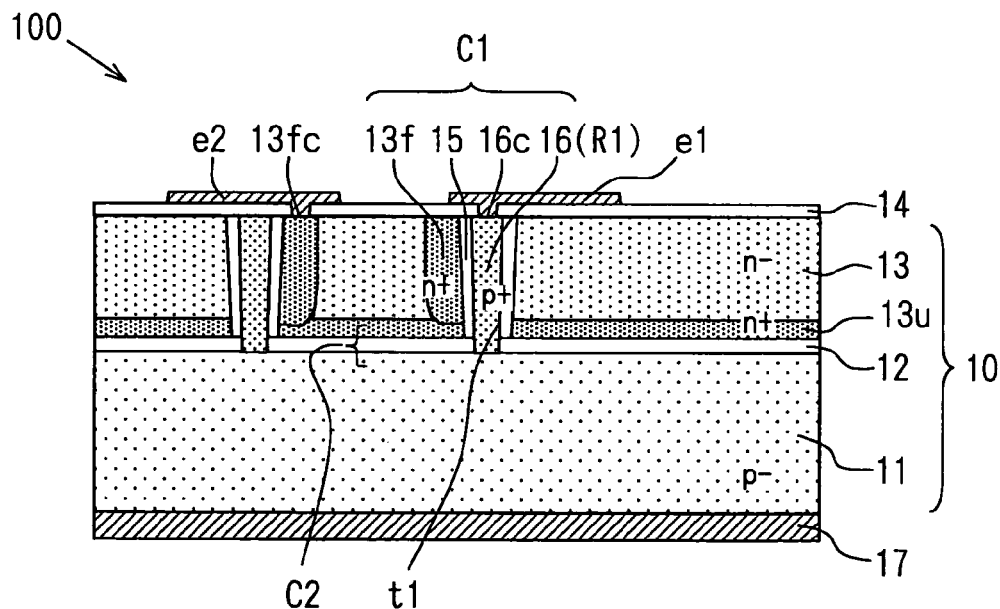
FIG. 1B is a cross sectional view showing the device taken along line IB—IB in FIG. 1A.

FIGS. 1A and 1B typically show the semiconductor device 100 according to the first embodiment of the present invention. FIG. 1A is a top plan of the semiconductor device 100. FIG. 1B is a cross section taken along line IB—IB in FIG. 1A.

As shown in FIG. 1B, the semiconductor device 100 employs a silicon (Si) semiconductor board 10 as a semiconductor substrate with an SOI (silicon on insulator) structure. The semiconductor board 10 has a first semiconductor layer 11 of the p-conductive type (p−), an insulation film 12 as a buried insulation film (i.e., an insulation layer), and a second semiconductor layer 13 of the n-conductive type. The insulation film 12 is buried in the semiconductor board 10 and formed out of silicon oxide film ($SiO_2$). The two semiconductor layers 11 and 13 are formed on the back and main sides respectively of the buried insulation film 12. The second semiconductor layer 13 includes a diffusion layer 13u as a fourth semiconductor layer of the n-conductive type (n−) buried in contact with the adjacent surface of the buried insulation film 12. The buried diffusion layer 13u is formed by the diffusion of antimony (Sb) or the like. The impurity concentration of the buried diffusion layer 13u is denser (n+) than the second semiconductor layer 13.

A trench t1 extends from the surface on the main side of the semiconductor board 10 through the buried insulation film 12 to the first semiconductor layer 11. A polycrystal silicon (poly-Si) layer 16 as a third semiconductor layer of the p-conductive type (p+) is buried in the trench t1, with sidewall insulation films 15 as a first insulation film interposed, which are oxide films. The polycrystal silicon layer 16 contains boron (B) or another impurity. As shown in FIG. 1A, the trench t1 takes the form of a closed ring in plan view, which surrounds a part of the second semiconductor layer 13.

The surrounded part of the second semiconductor layer 13 has a diffusion region 13f of the n-conductive type formed in contact with the inner sidewall insulation film 15 in the trench t1 in the form of a ring. The impurity concentration of the diffusion region 13f is denser (n+) than the second semiconductor layer 13. The bottom of the diffusion region 13f is in contact with the buried diffusion layer 13u, so that the diffusion region 13f and buried diffusion layer 13u are electrically connected.

As shown in FIG. 1B, the semiconductor device 100 has an insulation layer 14 as a second insulation film, a first electrode e1, and a second electrode e2. The insulation layer 14 is formed on the main side of the semiconductor board 10. The two electrodes e1 and e2 are formed on the top of the insulation layer 14. The first electrode e1 is connected via a contact 16c to the polycrystal silicon layer 16 in the trench t1. The second electrode e2 is connected via a contact 13fc to the diffusion region 13f. The semiconductor device 100 also has a metallic layer 17 formed on the surface on the backside of the semiconductor board 10. The metallic layer 17 functions as a heat radiator etc. and may be plated with copper (Cu), which is effective for heat radiation.

The semiconductor device 100 has a first capacitor C1, which consists of the inner sidewall insulation film 15 in the trench t1, the polycrystal silicon layer 16 formed outside the film 15 in the trench t1, and the diffusion region 13f inside the film 15. The semiconductor device 100 also has a second capacitor C2, which consists of the buried insulation film 12, the first semiconductor layer 11 on the lower side of the film 12, and the diffusion layer 13u in the second semiconductor layer 13 on the upper side of the film 12. Thus, not only the sidewall insulation film 15 in the trench t1 but also the buried insulation film 12 can be used as a capacitor. By adjusting the impurity density of the polycrystal silicon layer 16 buried in the trench t1, it is also possible to use the silicon layer 16 as a resistor R1. Because the first capacitor C1 and resistor R1 are vertical, they do not occupy large areas and may be used to remove noises from the semiconductor device 100. Thus, the semiconductor device 100 is a device employing a semiconductor board 10 with an SOI structure that has the insulation film 12 buried in the device 100, the device being small and having excellent noise removing capability.

Because the trench t1 extends through the buried insulation film 12 to the first semiconductor layer 11 on the back side, it is possible to fix the potential of the layer 11 by means of the polycrystal silicon layer 16 buried in the trench t1 and the first electrode e1 connected to the trench t1. This can also inhibit malfunctioning of the semiconductor device 100 due to noise.

If there were no need to fix the potential of the first semiconductor layer 11 and form the second capacitor C2 employing the buried insulation film 12, the trench t1 might extend only to the film 12 without extending through it.

A process for producing the semiconductor device 100 shown in FIGS. 1A and 1B will be described below.

FIGS. 2A to 5B are cross sections showing the steps of the process for producing the semiconductor device 100.

First, as shown in FIGS. 2A to 3B, two silicon semiconductor boards 10a and 10b having a thickness of about 300 μm are provided separately.

Figure 2A:
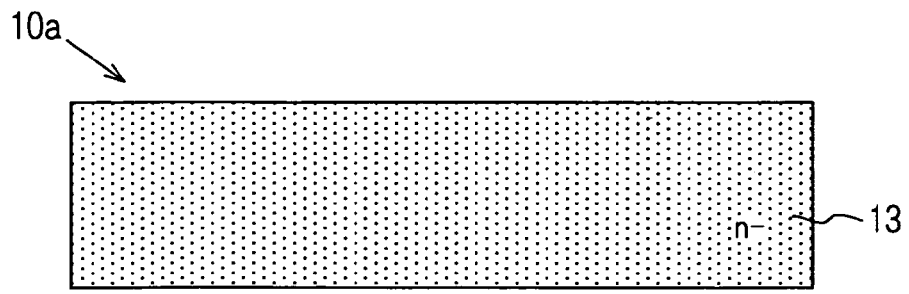
FIGS. 2A and 2B are cross sectional views explaining a method for manufacturing the device according to the first embodiment.

As shown in FIG. 2A, the silicon semiconductor board 10a is a silicon semiconductor board 13 of the n-conductive type (n−), which finally becomes the second semiconductor layer 13 of the semiconductor device 100.

Figure 2B:
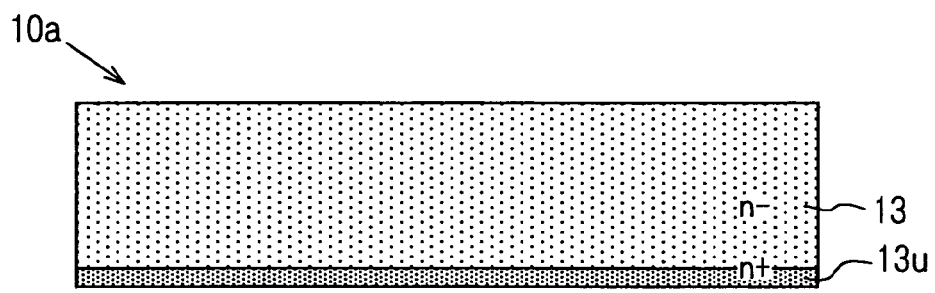

As shown in FIG. 2B, n-conductive type impurities are diffused from a surface of the silicon semiconductor board 13 so that a high-density (n+) diffusion layer 13u can be formed, which finally becomes the buried diffusion layer 13u of the second semiconductor layer 13.

Figure 3A:
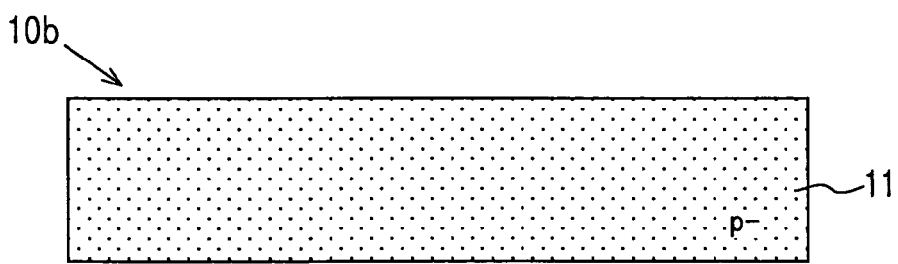
FIGS. 3A and 3B are cross sectional views explaining a method for manufacturing the device according to the first embodiment.

As shown in FIG. 3A, the other silicon semiconductor board 10b is a silicon semiconductor board 11 of the p-conductive type (p−), which finally becomes the first semiconductor layer 11 of the semiconductor device 100.

Figure 3B:
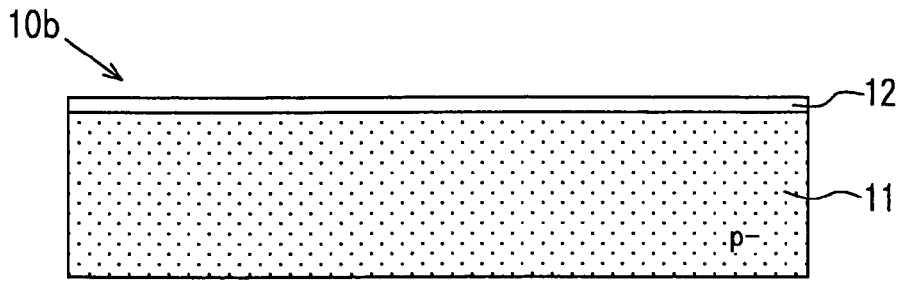

As shown in FIG. 3B, an oxide film 12, which finally becomes the buried insulation film 12 of the semiconductor device 100, is formed on a surface of the silicon semiconductor board 11.

Figure 4A:
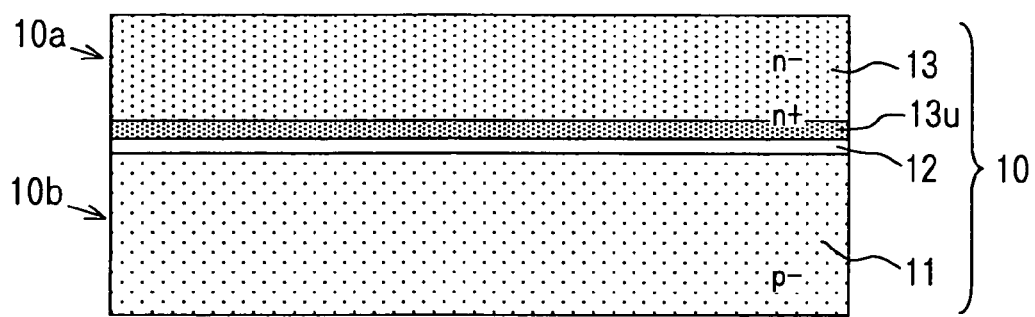
FIGS. 4A to 4C are cross sectional views explaining a method for manufacturing the device according to the first embodiment.

Next, as shown in FIG. 4A, the diffusion layer 13u of the silicon semiconductor board 10a and the oxide film 12 of the silicon semiconductor board 10b are bonded to each other by the ordinary silicon bonding technique. Subsequently, the silicon semiconductor board 10a is ground to a thickness (about 10 μm). This forms a semiconductor board 10 having an SOI structure, in which the oxide film 12 is the buried insulation film 12, with the first semiconductor layer 11 of the p-conductive type (p−) and the second semiconductor layer 13 of the n-conductive type (n−) formed on the back and main sides respectively of the buried insulation film 12.

Figure 4B:
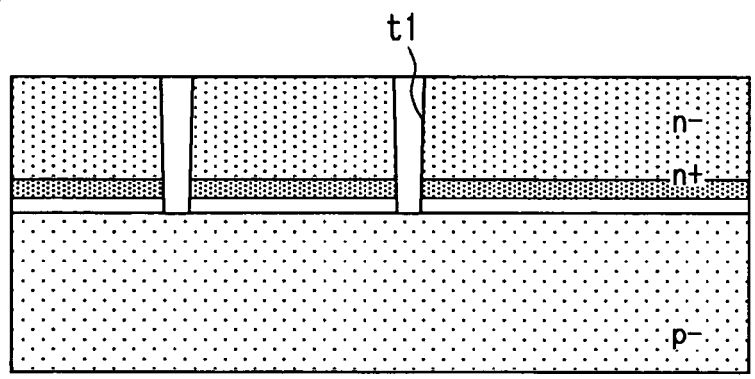

Next, as shown in FIG. 4B, a trench t1 is formed that extends from the main side of the semiconductor board 10 through the buried insulation film 12 to the first semiconductor layer 11. The formation of the trench t1 includes the steps of forming an etching mask having an opening on the main side of the semiconductor board 10, subsequently dry-etching the second semiconductor layer 13 from the mask opening until the trench t1 reaches the buried insulation film 12, and finally dry-etching or wet-etching the film 12.

Figure 4C:
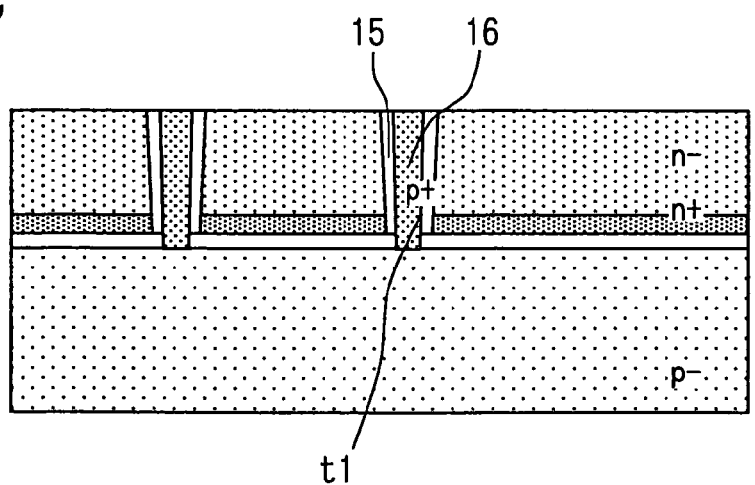

Next, as shown in FIG. 4C, sidewall insulation films 15 are formed in the trench t1 by means of thermal oxidation or the like. At the same time that the sidewall insulation films 15 are formed, a bottom insulation film is formed in the bottom of the trench t1. Subsequently, the bottom insulation film is removed so that the first semiconductor layer 11 can be exposed again. Thereafter, the trench t1 is filled with a polycrystal silicon.

Figure 5A:
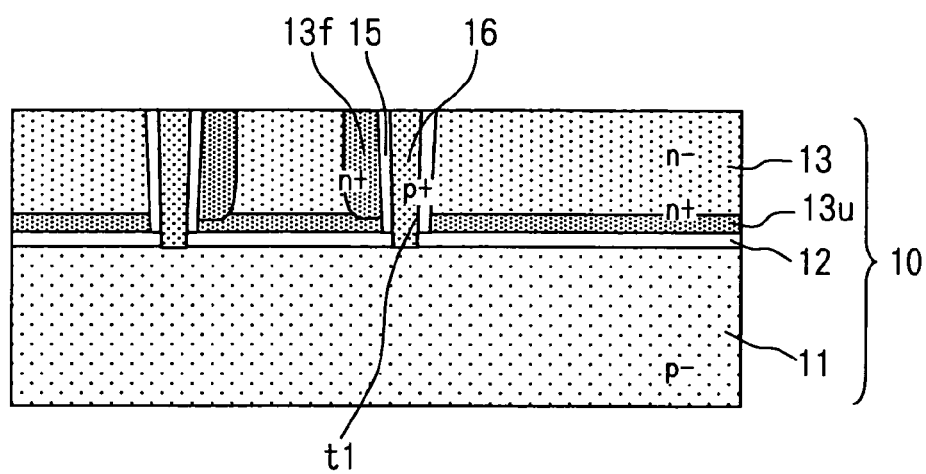
FIGS. 5A and 5B are cross sectional views explaining a method for manufacturing the device according to the first embodiment.

Next, as shown in FIG. 5A, a diffusion region 13f is formed by means of ion implantation and thermal diffusion of n-conductive type impurities. The diffusion region 13f extends to the buried diffusion layer 13u. Alternatively, the diffusion region 13f might be formed before the trench t1 is formed as shown in FIG. 4B.

Figure 5B:
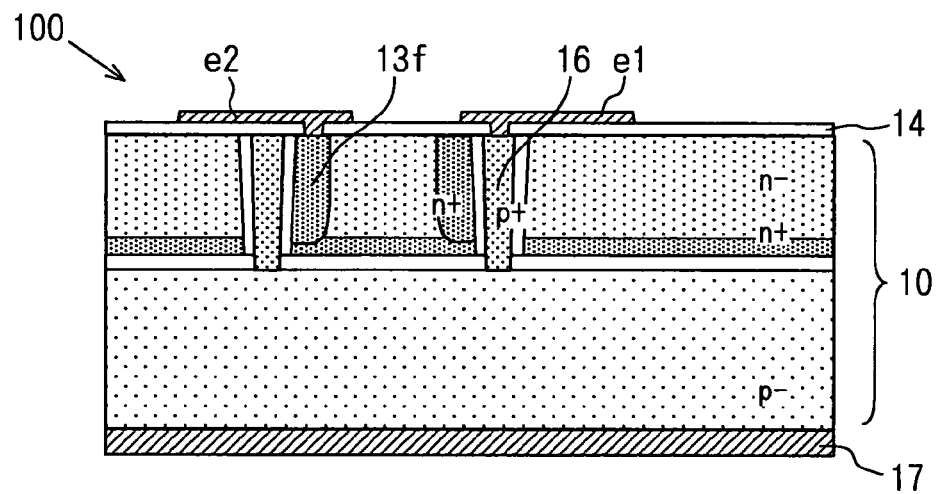

Next, as shown in FIG. 5B, an insulation layer 14 is laid on the main side of the semiconductor board 10. Subsequently, openings are formed through the insulation layer 14. Lastly, a first electrode e1 and a second electrode e2 are formed on the insulation layer 14 and connected to the polycrystal silicon layer 16 and diffusion region 13f respectively. In the meantime, a metallic layer 17 is formed on the back side of the semiconductor board 10.

Thus, the semiconductor device 100 shown in FIGS. 1A and 1B is formed.

Figure 6:
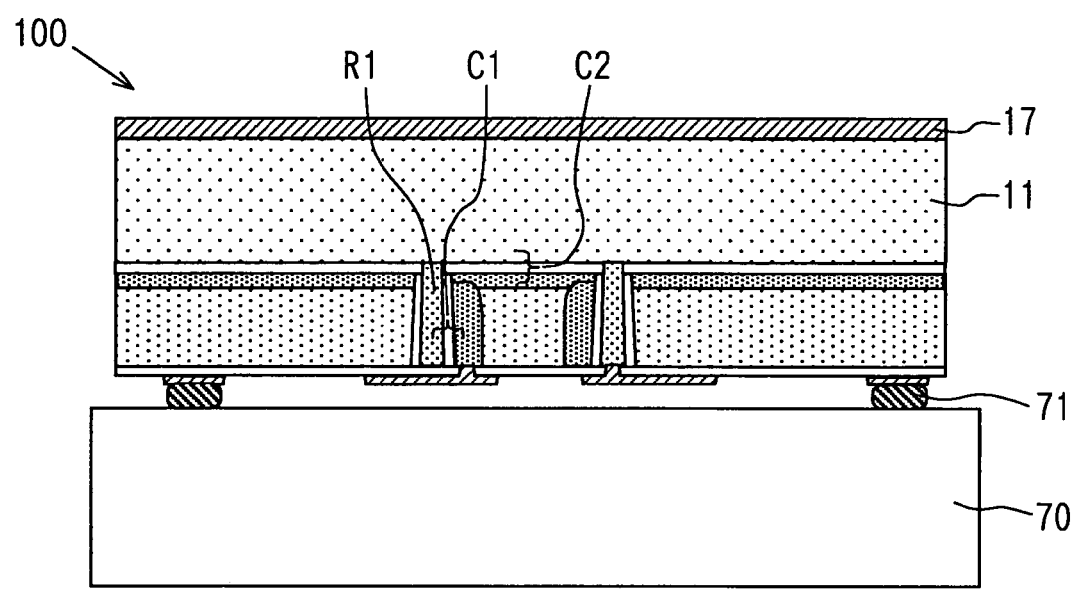
FIG. 6 is a cross sectional view showing the device mounted on a wiring board, according to the first embodiment.

FIG. 6 is a typical cross section showing the semiconductor device 100 mounted via solder bumps 71 on a wiring board 70 by means of flip chip packaging.

As shown in FIG. 6, the semiconductor device 100 is mounted by means of flip chip packaging, with its main side facing the wiring board 70. This makes it possible to reduce the wiring delay of the semiconductor device 100 and the size of the package. In particular, for a CSP (chip size package) structure in which the semiconductor device 100 and wiring board 70 are nearly equal in size, the package of the device 100 can be minimized.

For flip chip packaging and/or CSP structure, as explained with reference to FIG. 13, such problems arise as radiation of heat generated in the semiconductor elements and malfunctioning due to noises from the metallic layer 17, which is formed for higher heat radiation capability. By contrast, it is easy to radiate heat from the semiconductor device 100 shown in FIG. 6 because the metallic layer 17, which has high heat radiation capability, is formed on the back side of the device 100. As stated already, the semiconductor device 100 is small and has excellent noise removing capability, with the capacitors C1 and C2 and resistor R1 formed in it, and with the potential of the first semiconductor layer 11 fixed.

Figure 7A:
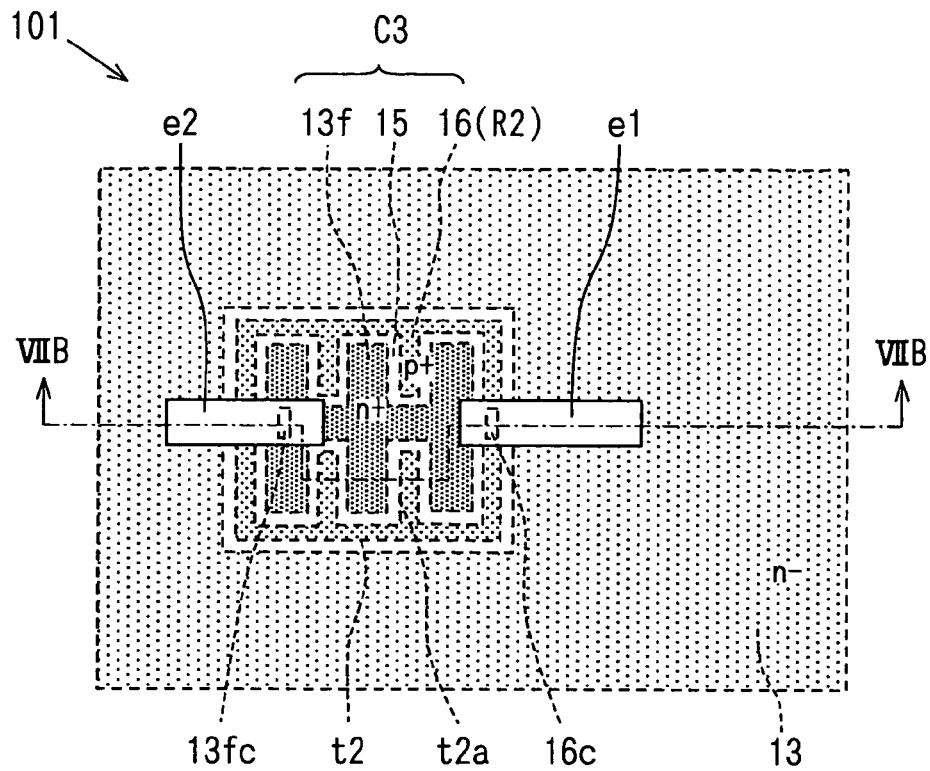
FIG. 7A is a plan view showing another semiconductor device according to a modification of the first embodiment.
Figure 7B:
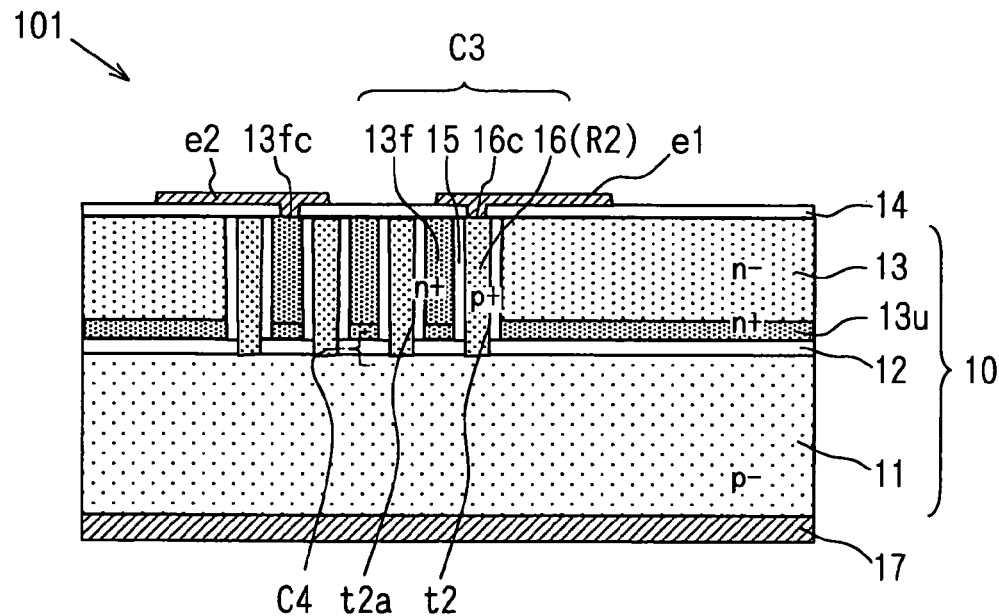
FIG. 7B is a cross sectional view showing the device taken along line VIIB—VIIB in FIG. 7A.

FIGS. 7A and 7B typically show another semiconductor device 101 according to this embodiment. FIG. 7A is a top plan of the semiconductor device 101. FIG. 7B is a cross section taken along line VIIB—VIIB of FIG. 7A. The same reference numerals are assigned to the similar parts of the semiconductor device 101 and the semiconductor device 100 shown in FIGS. 1A and 1B, and no description will be provided of the similar parts of the device 101.

As shown in FIG. 1A, the trench t1 of the semiconductor device 100 takes the form of a closed ring in plan view. As shown in FIGS. 7A and 7B, the semiconductor device 101 has a trench t2 in the form of a ring. The trench t2 has branches t2a extending toward the part of the second semiconductor layer that is surrounded by the ring. The ring of the semiconductor device 101 is roughly rectangular. The branches t2a extend in the form of comb teeth from opposite sides of the roughly rectangular ring.

As is the case with the semiconductor device 100 shown in FIGS. 1A and 1B, the semiconductor device 101 has a first capacitor C3 employing the sidewall insulation films 15, a second capacitor C4 employing the buried insulation film 12, and a resistor R2 employing the polycrystal silicon layer 16 in the trench t2 and branches t2a. The sidewall insulation films 15 in the trench t2 in the form of a ring and the branches t2a have a total area larger than that of the sidewall insulation films 15 in the trench t1 in the form of a ring without branches. Accordingly, the first capacitor C3 employing the sidewall insulation films 15 of the semiconductor device 101 is higher in capacitance than the first capacitor C1 employing the sidewall insulation film 15 of the semiconductor device 100.

Figure 8A:
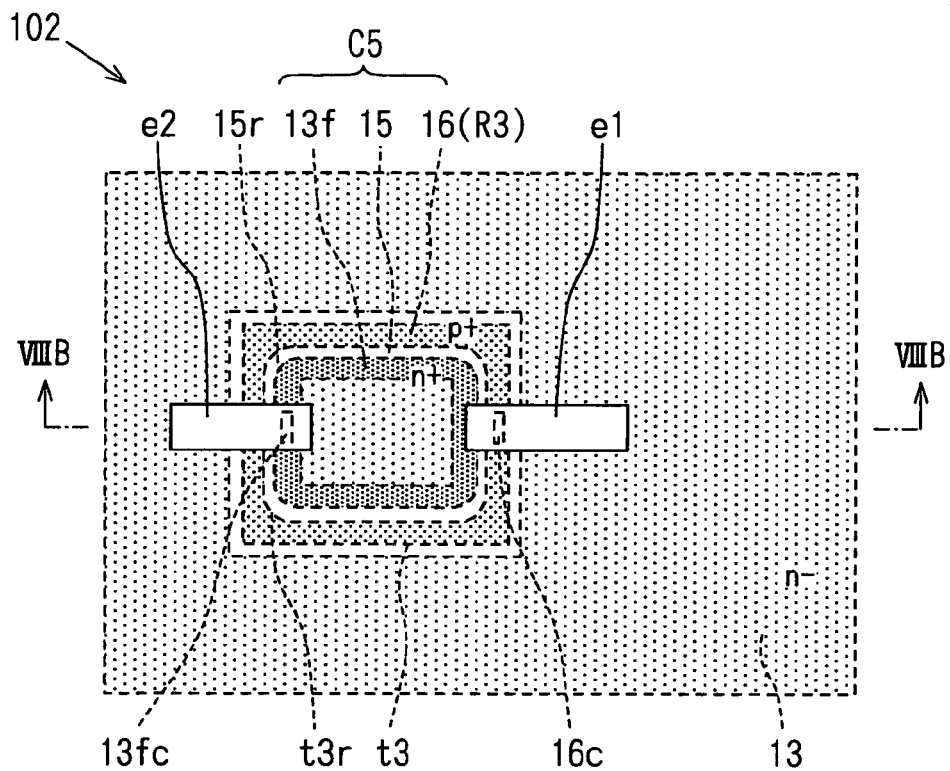
FIG. 8A is a plan view showing further another semiconductor device according to another modification of the first embodiment.
Figure 8B:
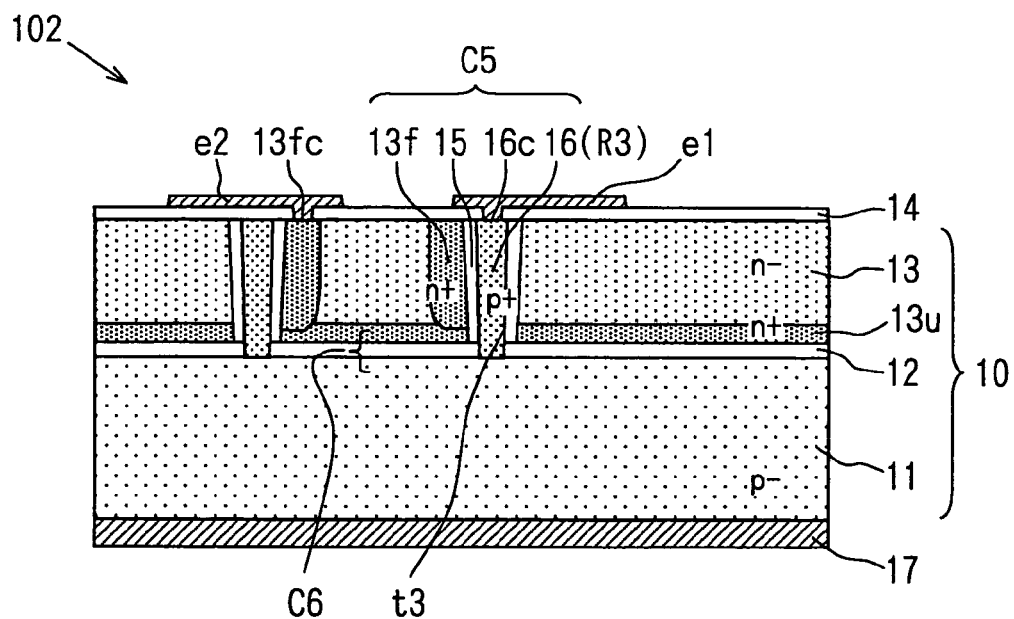
FIG. 8B is a cross sectional view showing the device taken along line VIIIB—VIIIB in FIG. 7A.

FIGS. 8A and 8B typically show still another semiconductor device 102 according to this embodiment. FIG. 8A is a top plan of the semiconductor device 102. FIG. 8B is a cross section taken along line VIIIB—VIIIB of FIG. 8A. The same reference numerals are assigned to the similar parts of the semiconductor device 102 and the semiconductor device 100 shown in FIGS. 1A and 1B.

As shown in FIG. 1A, the trench t1 of the semiconductor device 100 has sharp corners t1c in plan view. Accordingly, the sidewall insulation films 15 in the trench t1 have sharp corners 15c. As shown in FIGS. 8A and 8B, the semiconductor device 102 has a trench t3 in the form of a ring. As shown in FIG. 8A as a plan view, the inner sidewall insulation film 15 in the trench t3 has round corners 15r.

As is the case with the semiconductor device 100 shown in FIGS. 1A and 1B, the semiconductor device 102 has a first capacitor C5 employing the sidewall insulation film 15, a second capacitor C6 employing the buried insulation film 12, and a resistor R3 employing the polycrystal silicon layer 16 in the trench t3. As stated above, the corners 15r of the inner sidewall insulation film 15 of the semiconductor device 102 are round. This curbs the electric field concentration at the corners of the first capacitor C5 formed on both sides of the inner sidewall insulation film 15. For this reason, the first capacitor C5 can be prevented from having such breakdowns as may occur at the corners of the first capacitor C1 of the semiconductor device 100.

Second Embodiment

Each of the semiconductor devices 100–102 according to the first embodiment has one trench in the form of a closed ring in plan view. The trench is formed on the main side of a semiconductor board having an SOI structure. Each of these semiconductor devices 100–102 also has a capacitor employing a sidewall insulation film in its trench. A semiconductor device according to a second embodiment of the present invention has a first trench similar to the foregoing trench and a second trench. The second trench takes the form of a closed ring in plan view and is formed inside the first trench. This embodiment will be described below with reference to the drawings.

Figure 9A:
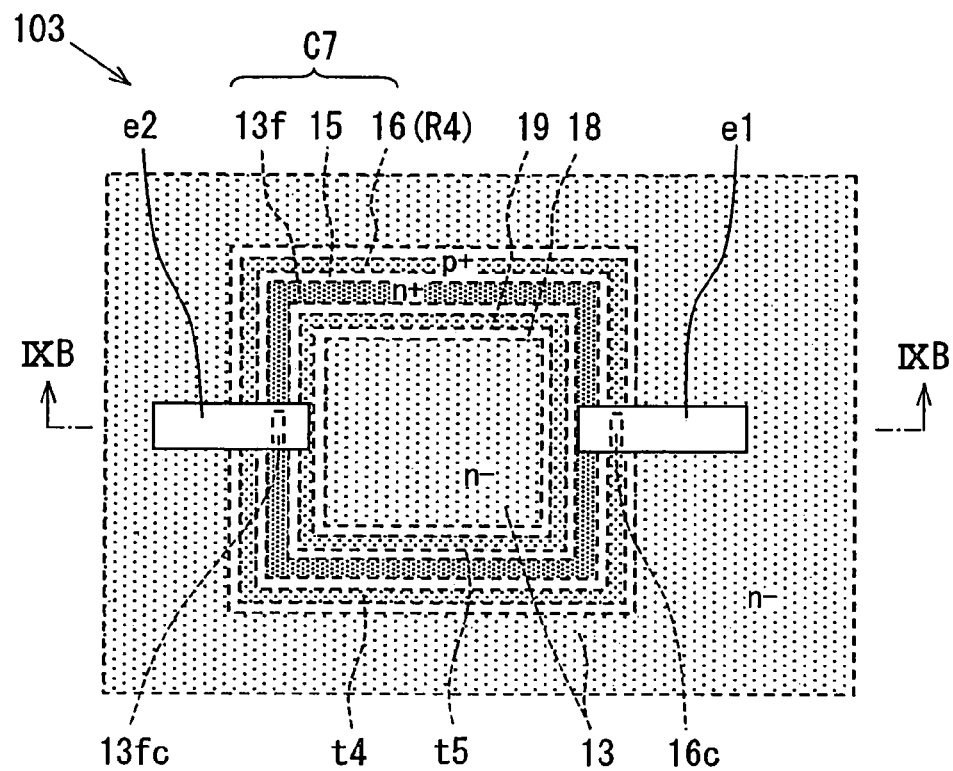
FIG. 9A is a plan view showing a semiconductor device according to a second embodiment of the present invention.
Figure 9B:
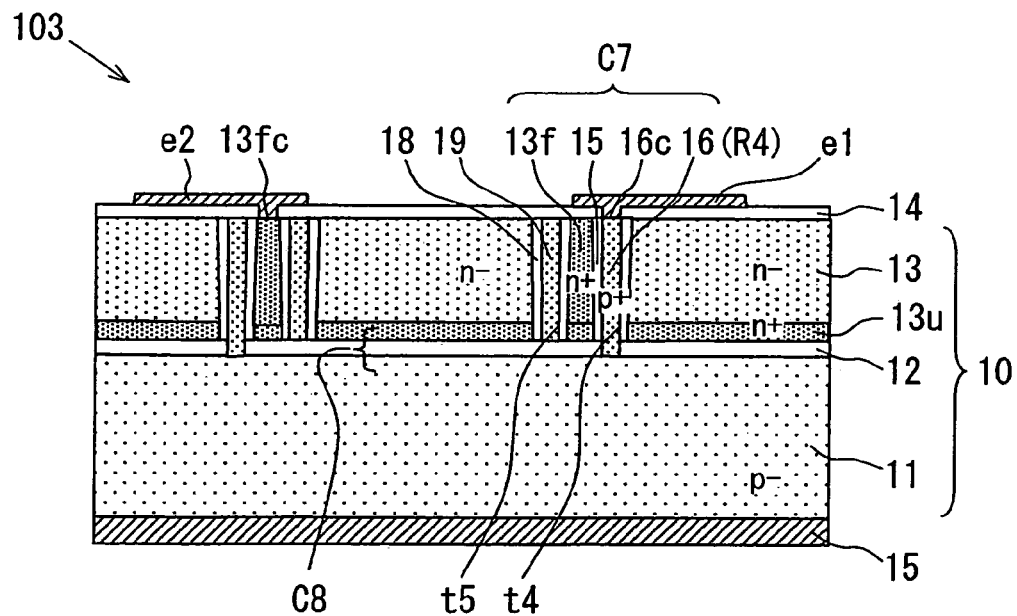
FIG. 9B is a cross sectional view showing the device taken along line IXB—IXB in FIG. 9A.

FIGS. 9A and 9B typically show the semiconductor device 103 according to this embodiment. FIG. 9A is a top plan of the semiconductor device 103. FIG. 9B is a cross section taken along line IXB—IXB of FIG. 9A. The same reference numerals are assigned to the similar parts of the semiconductor device 103 and the semiconductor device 100 shown in FIGS. 1A and 1B.

The semiconductor device 103 has a first trench t4 similar to the trench of the semiconductor device 100. The semiconductor device 103 also has a second trench t5 formed inside its diffusion region 13f. As is the case with the first trench t4, the second trench t5 takes the form of a closed ring in plan view, which surrounds a part of second semiconductor layer 13. As shown in cross section, the first trench t4 extends through buried insulation film 12 to first semiconductor layer 11, while the second trench t5 extends only to the buried insulation film 12 without extending through it. Polycrystal silicon layer 19 a fifth semiconductor layer is buried in the second trench t5 also, with sidewall insulation films 18 as a third insulation film interposed. The part of second semiconductor layer 13 surrounded by the second trench t5 is isolated from the periphery. For this reason, by forming arbitrary semiconductor elements (not shown) in the isolated part of the second semiconductor layer 13, it is possible to reduce the influence of noises from the outside. Consequently, the semiconductor elements can be highly integrated in the semiconductor device 103.

As is the case with the semiconductor device 100, the semiconductor device 103 has a first capacitor C7 employing the sidewall insulation film 15, a second capacitor C8 employing the buried insulation film 12, and a resistor R4 employing the polycrystal silicon layer 16 in the trench t4. Consequently, the semiconductor elements of the semiconductor device 103 are highly integrated, and the influence on them of noises from the outside is reduced as is the case with the first embodiment.

The formation of the trenches t4 and t5 may include, in the trench forming process shown with FIG. 4B, the steps of simultaneously forming trenches t4 and t5 by means of dry etching that extend to the oxide film 12, subsequently masking only the second trench t5 with a resist, and finally forming an extension of the first trench t4 to the first semiconductor layer 11 by means of wet etching or the like.

Third Embodiment

Each of the semiconductor devices according to the first embodiment has a capacitor employing a trench sidewall insulation film. Semiconductor devices according to a third embodiment of the present invention have diodes formed in them. This embodiment will be described below with reference to the drawings.

Figure 10:
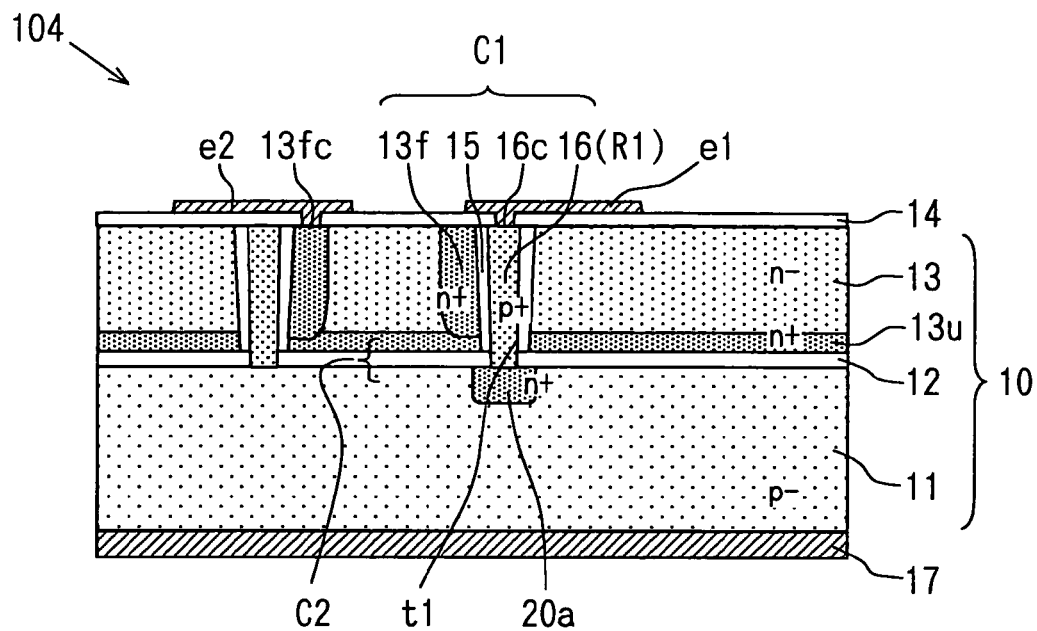
FIG. 10 is a cross sectional view showing a semiconductor device according to a third embodiment of the present invention.

FIG. 10 is a cross section typically showing a semiconductor device 104 according to this embodiment. The same reference numerals are assigned to the similar parts of the semiconductor device 104 and the semiconductor device 100 shown in FIGS. 1A and 1B.

The semiconductor device 104 is similar in structure to the semiconductor device 100 shown in FIGS. 1A and 1B, but has another diffusion region 20a of the n-conductive type (n+), which is buried in first semiconductor layer 11 and formed in contact with the adjacent surface of buried insulation film 12. Trench t1 extends to the buried diffusion region 20a. The formation of the buried diffusion region 20a of the n-conductive type leads to the formation of a diode employing the adjacent surface of either the first semiconductor layer 11 of the p-conductive type or the polycrystal silicon layer 16 of the p-conductive type buried in the trench t1. The diode also may be used to remove noises from the semiconductor device 104.

Thus, the semiconductor device 104 has a diode in addition to a first capacitor C1 employing the sidewall insulation film 15, a second capacitor C2 employing the buried insulation film 12, and a resistor R1 employing the polycrystal silicon layer 16 as is the case with the semiconductor device 100. The influence of noises from the outside on the semiconductor device 104 is reduced.

The buried diffusion region 20a is formed by means of ion implantation before oxide film 12 is formed in the preparatory process shown with FIG. 3A for semiconductor board 10b.

Figure 11:
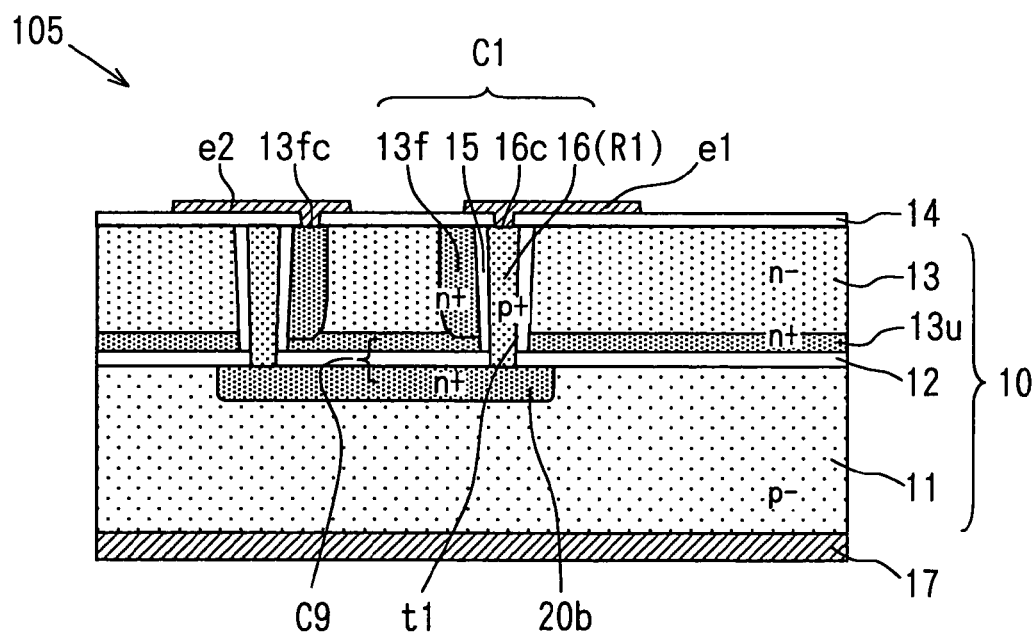
FIG. 11 is a cross sectional view showing another semiconductor device according to a modification of the third embodiment.

FIG. 11 is a cross section typically showing another semiconductor device 105 according to this embodiment. The semiconductor device 105 has a diffusion region 20b similar to the buried diffusion region 20a of the semiconductor device 104. The diffusion region 20b is buried around trench t1 in the form of a ring in plan view. The buried diffusion region 20b is formed in semiconductor board 10b not bonded yet as shown in FIG. 3A. As stated above, the buried diffusion region 20b has a large area surrounding the trench t1 in the form of a ring. This makes it easy to align the trench t1 (to align the buried polycrystal silicon layer 16). The semiconductor device 105 also has a second capacitor C9, which consists of the buried insulation film 12, the buried diffusion region 20b in the first semiconductor layer 11 on the lower side of the film 12, and the diffusion layer 13u in the second semiconductor layer 13 on the upper side of the film 12.

Such changes and modifications are to be understood as being within the scope of the present invention as defined by the appended claims.

What is claimed is:
1. A semiconductor device comprising:
 a semiconductor substrate including a first semiconductor layer, an insulation layer and a second semiconductor layer, which are laminated in this order;
 a trench penetrating both of the second semiconductor layer and the insulation layer and reaching the first semiconductor layer;
 a third semiconductor layer; and
 first and second electrodes,
 wherein the second semiconductor layer is disposed on a principal surface of the substrate, and the first semiconductor layer is disposed on a backside of the substrate,
 wherein the trench has a ring shape on the principal surface so that a part of the second semiconductor layer and a part of the insulation layer are surrounded with the trench,
 wherein the third semiconductor layer is disposed in the trench through a first insulation film disposed on a sidewall of the trench so that the third semiconductor layer contacts the first semiconductor layer at a bottom of the trench,
 wherein the first electrode is disposed on the principal surface of the substrate through a second insulation film, and electrically connects to the third semiconductor layer through a contact hole, and wherein the second electrode is disposed on the principal surface of the substrate through the second insulation film, and electrically connects to the part of the second semiconductor layer surrounded by the trench through another contact hole.

2. The device according to claim 1,
wherein the third semiconductor layer is made of poly crystalline silicon.

3. The device according to claim 1,
wherein the first insulation film is a dielectric film of a capacitor.

4. The device according to claim 1,
wherein the insulation layer is a dielectric film of a capacitor.

5. The device according to claim 1,
wherein the first semiconductor layer has a first conductive type, the second semiconductor layer has a second conductive type, and the third semiconductor layer has the first conductive type with an impurity concentration higher than the first semiconductor layer.

6. The device according to claim 5,
wherein the first conductive type is a P conductive type, and the second conductive type is an N conductive type.

7. The device according to claim 5,
wherein the part of the second semiconductor layer surrounded by the trench further includes a diffusion layer disposed inside of the first insulation film so that the diffusion layer surrounds the part of the second semiconductor layer,
wherein the diffusion layer has the second conductive type with an impurity concentration higher than the part of the second semiconductor layer, and
wherein the second electrode on the second insulation layer connects to the diffusion layer through the contact hole.

8. The device according to claim 7,
wherein the third semiconductor layer, the first insulation film and the diffusion layer provide a first capacitor.

9. The device according to claim 7, further comprising:
a fourth semiconductor layer disposed between the insulation layer and the second semiconductor layer,
wherein the fourth semiconductor layer has the second conductive type with an impurity concentration higher than the second semiconductor layer, and
wherein the fourth semiconductor layer contacts the diffusion layer.

10. The device according to claim 9,
wherein the fourth semiconductor layer, the insulation layer and the first semiconductor layer provide a second capacitor.

11. The device according to claim 1, further comprising:
a metallic layer disposed on the backside of the semiconductor substrate.

12. The device according to claim 1, further comprising:
a wiring board,
wherein the wiring board is disposed on the principal surface of the semiconductor substrate through a bump so that a flip chip is provided.

13. The device according to claim 12,
wherein the device provides a chip size package construction.

14. A semiconductor device comprising:
a semiconductor substrate including a first semiconductor layer, an insulation layer and a second semiconductor layer, which are laminated in this order;
a trench penetrating both of the second semiconductor layer and the insulation layer and reaching the first semiconductor layer;
a third semiconductor layer; and
a diffusion region having the second conductive type with an impurity concentration higher than the second semiconductor layer,
wherein the second semiconductor layer is disposed on a principal surface of the substrate, and the first semiconductor layer is disposed on a backside of the substrate,
wherein the trench has a ring shape on the principal surface so that a part of the second semiconductor layer and a part of the insulation layer are surrounded with the trench,
wherein the third semiconductor layer is disposed in the trench through a first insulation film disposed on a sidewall of the trench so that the third semiconductor layer contacts the first semiconductor layer at a bottom of the trench,
wherein the first semiconductor layer has a first conductive type, the second semiconductor layer has a second conductive type, and the third semiconductor layer has the first conductive type with an impurity concentration higher than the first semiconductor layer, and
wherein the diffusion region is disposed between the insulation layer and the first semiconductor layer, and is disposed under and contacts the third semiconductor layer.

15. The device according to claim 14,
wherein the diffusion region surrounds the trench in plan view.

16. A semiconductor device comprising:
a semiconductor substrate including a first semiconductor layer, an insulation layer and a second semiconductor layer, which are laminated in this order;
a trench penetrating both of the second semiconductor layer and the insulation layer and reaching the first semiconductor layer; and
a third semiconductor layer,
wherein the second semiconductor layer is disposed on a principal surface of the substrate, and the first semiconductor layer is disposed on a backside of the substrate,
wherein the trench has a ring shape on the principal surface so that a part of the second semiconductor layer and a part of the insulation layer are surrounded with the trench,
wherein the third semiconductor layer is disposed in the trench through a first insulation film disposed on a sidewall of the trench so that the third semiconductor layer contacts the first semiconductor layer at a bottom of the trench, and
wherein the inner sidewall of the trench has a rectangular shape with four round corners in plan view.

17. The device according to claim 16,
wherein the trench has a branch extending toward the part of the second semiconductor layer.

18. The device according to claim 16,
wherein the trench has a plurality of branches extending toward the part of the second semiconductor layer to be a comb tooth.

19. The device according to claim 18,
wherein the inner sidewall of the trench provides a rectangular shape having a pair of sides facing each other, and
wherein the branches protrude from the pair of the sides.

20. The device according to claim 16, wherein the trench is a first trench, the device further comprising:
a second trench penetrating the second semiconductor layer and reaching the insulation layer; and
a fifth semiconductor layer,
wherein the second trench has a ring shape on the principal surface, and is disposed inside of the first trench so that the part of the second semiconductor layer is surrounded with the second trench and the first trench, and
wherein the fifth semiconductor layer is disposed in the second trench through a third insulation film.

21. A semiconductor device comprising:
a semiconductor substrate including a first semiconductor layer, an insulation layer and a second semiconductor layer, which are laminated in this order;
a trench penetrating the second semiconductor layer and reaching the insulation layer;
a third semiconductor layer; and
first and second electrodes,
wherein the first semiconductor layer is disposed on a backside of the substrate, and the second semiconductor layer is disposed on a principal surface of the substrate,
wherein the trench has a ring shape on the principal surface in a plan view so that a part of the second semiconductor layer is surrounded with the trench,
wherein the third semiconductor layer is disposed in the trench through a first insulation film disposed on a sidewall of the trench,
wherein the first electrode is disposed on the principal surface of the substrate through a second insulation film, and electrically connects to the third semiconductor layer in the trench through a contact hole,
wherein the second electrode is disposed on the principal surface of the substrate through the second insulation film, and electrically connects to the part of the second semiconductor layer through another contact hole, and
wherein the trench has a branch extending toward the part of the second semiconductor layer.

22. The device according to claim 21,
wherein the third semiconductor layer is made of poly crystalline silicon.

23. The device according to claim 21,
wherein the first insulation films is a dielectric film of a capacitor.

24. The device according to claim 21,
wherein the first semiconductor layer has a first conductive type, the second semiconductor layer has a second conductive type, and the third semiconductor layer has the first conductive type with an impurity concentration higher than the first semiconductor layer.

25. The device according to claim 24,
wherein the first conductive type is a P conductive type, and the second conductive type is a N conductive type.

26. The device according to claim 24,
wherein the part of the second semiconductor layer surrounded by the trench further includes a diffusion layer disposed inside of the first insulation film so that the diffusion layer surrounds the part of the second semiconductor layer,
wherein the diffusion layer has the second conductive type with an impurity concentration higher than the second semiconductor layer, and
wherein the second electrode on the second insulation layer connects to the diffusion layer through the contact hole.

27. The device according to claim 26,
wherein the third semiconductor layer, the first insulation film and the diffusion layer provide a first capacitor.

28. The device according to claim 26, further comprising:
a fourth semiconductor layer disposed between the insulation layer and the second semiconductor layer,
wherein the fourth semiconductor layer has the second conductive type with an impurity concentration higher than the second semiconductor layer, and
wherein the fourth semiconductor layer contacts the diffusion layer.

29. The device according to claim 21,
wherein the trench has a plurality of branches extending toward the part of the second semiconductor layer to be a comb tooth.

30. The device according to claim 29,
wherein the inner sidewall of the trench provides a rectangular shape having a pair of sides facing each other, and
wherein the branches protrude from the pair of the sides.

31. The device according to claim 21,
wherein the inner sidewall of the trench has a rectangular shape with four round corners in plan view.

32. The device according to claim 21, wherein the trench is a first trench, the device further comprising:
a second trench penetrating the second semiconductor layer and reaching the insulation layer; and
a fifth semiconductor layer,
wherein the second trench has a ring shape on the principal surface, and is disposed inside of the first trench so that the part of the second semiconductor layer is surrounded with the second trench and the first trench, and
wherein the fifth semiconductor layer is disposed in the second trench through a third insulation film.

33. The device according to claim 21, further comprising:
a metallic layer disposed on the backside of the semiconductor substrate.

34. The device according to claim 21, further comprising:
a wiring board,
wherein the wiring board is disposed on the principal surface of the semiconductor substrate through a bump so that a flip chip is provided.

35. The device according to claim 21,
wherein the device provides a chip size package construction.

* * * * *